United States Patent
Ahmed et al.

(10) Patent No.: US 11,043,655 B2
(45) Date of Patent: Jun. 22, 2021

(54) EFFICIENCY ORGANIC LIGHT EMITTING DIODE DISPLAYS

(71) Applicant: Intel Corporation, Santa Clara, CA (US)

(72) Inventors: Khaled Ahmed, Anaheim, CA (US); Jun Jiang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/456,797

(22) Filed: Jun. 28, 2019

(65) Prior Publication Data

US 2019/0326558 A1   Oct. 24, 2019

(51) Int. Cl.
*H01L 51/52* (2006.01)
*H01L 27/32* (2006.01)
*H01L 51/56* (2006.01)
*G02B 5/02* (2006.01)

(52) U.S. Cl.
CPC ...... *H01L 51/5268* (2013.01); *H01L 27/3244* (2013.01); *H01L 51/5218* (2013.01); *H01L 51/5234* (2013.01); *H01L 51/5253* (2013.01); *H01L 51/5281* (2013.01); *H01L 51/56* (2013.01); *G02B 5/0242* (2013.01); *H01L 2251/303* (2013.01); *H01L 2251/5315* (2013.01); *H01L 2251/5369* (2013.01)

(58) Field of Classification Search
CPC combination set(s) only.
See application file for complete search history.

(56) References Cited

U.S. PATENT DOCUMENTS

| | | | | |
|---|---|---|---|---|
| 2006/0250084 A1* | 11/2006 | Cok | ..................... | H01L 51/5253 313/512 |
| 2007/0013293 A1* | 1/2007 | Cok | ..................... | H01L 51/525 313/504 |
| 2008/0129189 A1* | 6/2008 | Cok | ..................... | H01L 51/5268 313/503 |
| 2012/0217863 A1* | 8/2012 | Hamatani | ............ | G02B 5/0226 313/116 |
| 2013/0033754 A1* | 2/2013 | Lin | ..................... | G02B 5/0278 359/599 |
| 2017/0018741 A1* | 1/2017 | Osawa | ................ | H01L 51/5268 |
| 2017/0125737 A1* | 5/2017 | Sakaguchi | ........... | G02B 5/0236 |

* cited by examiner

*Primary Examiner* — Michelle Mandala
*Assistant Examiner* — Jordan M Klein
(74) *Attorney, Agent, or Firm* — Hanley, Flight & Zimmerman, LLC (57) ABSTRACT

The present disclosure is directed to systems and methods of improving the efficiency and reducing the power consumption of organic light emitting diode (OLED) display devices. The OLED display device includes an OLED display layer that includes a substrate, an anode layer, a transparent cathode layer, and a plurality of OLED display pixels disposed between the anode and the cathode layers. A light-scattering layer is selectively or randomly disposed on, across, or about at least a portion of the surface of the OLED display layer. The light-scattering layer includes one or more monolayers, each of which includes a plurality of nanoparticles having a principal dimension that is greater than 10% of the wavelength of the electromagnetic energy emitted by the OLED display layer.

24 Claims, 6 Drawing Sheets

EFFICIENCY ORGANIC LIGHT EMITTING DIODE DISPLAYS

TECHNICAL FIELD

The present disclosure relates to display technology, more specifically organic light emitting diode (OLED) display technology.

BACKGROUND

Flexible displays may be bent, rolled, folded, or twisted in many different configurations to provide a relatively large format display in a relatively small form factor package. Organic light emitting diodes (OLED) displays, by virtue of their relative thinness compared to other display technologies lend themselves to use as flexible displays. However, the multi-layer structure of most OLED display devices causes a number of internal reflections within the OLED display, reducing the intensity and/or brightness of the display output, reducing display efficiency and increasing power demand Such increased power demand detrimentally impacts the battery life of portable devices such as smartphones, portable computers, laptops, and similar.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Although the following Detailed Description will proceed with reference being made to illustrative embodiments, many alternatives, modifications and variations thereof will be apparent to those skilled in the art.

DETAILED DESCRIPTION

Organic light emitting diode (OLED) display devices typically include a substrate, a reflective anode, an organic layer stack, and a transparent top cathode. Light generated by the device is emitted through the transparent top cathode. In such devices, it is estimated that due to internal reflection attributable to the differences in refractive indices in the various layers the emitted light must penetrate, only 20% of the light generated by the device is visible to the device user, the remainder being lost within the display device.

Light incident from a high index material onto an interface with a lower index medium will undergo total internal reflection (TIR) for all incidence angles greater than the critical angle $\theta_C$, defined by $\theta_C = \sin^{-1}(n_2/n_1)$, where $n_1$ and $n_2$ are the refractive indices of the high- and low index regions, respectively. The electromagnetic field associated with this light reflected by TIR extends into the lower-index region in an evanescent standing wave, but the strength of this field diminishes exponentially with distance from the interface.

The systems and methods disclosed herein beneficially improve the efficiency of OLED devices by increasing the visible output of the display device without increasing the overall power demand of the display device. The systems and methods described herein enhance light extraction from an OLED display device using an index-contrasting film with randomly distributed, high-index, nanostructures disposed proximate the OLED element layer. Such high-index nanostructures may be created by coating nanoparticles such as: indium tin oxide (ITO), silicon nitride ($Si_3N_4$), calcium oxide (CaO), antimony oxide ($Sb_2O_3$), titanium oxide ($TiO_2$), zirconium oxide ($ZrO_2$), tantalum pentoxide ($Ta_2O_5$), hafnium oxide ($HfO_2$), niobium oxide ($Nb_2O_3$), magnesium oxide (MgO), zinc oxide (ZnO), indium oxide ($In_2O_3$), tin oxide ($Sn_2O_3$), aluminum nitride (AlN), gallium nitride (GaN), or any other high index materials on a substrate used in OLED fabrication or encapsulation. Subsequent application a low index coating, such as $SiO_2$, $Al_2O_3$, or polymeric materials over the nanoparticles provides the index contrast needed for scattering or diffraction efficiency and to planarize the surface. A nanostructured layer effectively uses micro-replicated scattering nanostructures located near enough to the light generation region to enable extraction of an evanescent wave from an organic light emitting diode (OLED) device.

Scattering entities located within this evanescent zone, typically about one wavelength thick, can disrupt the TIR and cause the light to pass through the interface. Therefore, it is preferable that the nanostructured index contrast layer be located within the evanescent zone if it is to be most effective in causing extraction of the light from the emission region by scattering or diffraction.

As used herein the terms "nanostructure" or "nanostructures" refer to structures having at least one principal dimension (e.g., height, length, width, or diameter) of less than 2 microns and more preferably less than one micron. Nanostructures may include but are not limited to one or more of: particles and/or engineered structures. Such particles and engineered structures may have a regular physical geometry, irregular physical geometries, or combinations thereof. Such particles and engineered structures may be referred to generically as "nanoparticles." The term "nanostructured" refers to a material or layer having nanostructures. As used herein, the term "physical geometry" refers to a three dimensional (3D) structure that may include a solid structure (e.g., a cylindrical solid or spherical solid); an open structure (e.g., a lattice structure such as a helix); or any combination thereof.

The systems and methods disclosed herein beneficially enhance the output of an OLED display by depositing a light-scattering nanoparticle layer proximate the OLED element layer within the display device. The light-scattering nanoparticle layer may be deposited as a monolayer across all or a portion of the emissive surface of the OLED element layer. The light-scattering nanoparticle layer may be deposited as a monolayer across a flexible and/or folding OLED display device. The nanoparticles are selected to achieve anisotropic Mie scattering of the incident electromagnetic energy. The nanoparticles may be selected such that the particle size exceeds a threshold of $\lambda/10$ to cause anisotropic Mie scattering. With Mie scattering, the scattered electromagnetic energy is unequal in energy to the incident light (i.e., inelastic scattering) and angle-dependent such that the scattered light in the direction toward the incident light has greater energy than electromagnetic energy scattered in other directions.

An OLED display apparatus is provided. The display apparatus may include: an organic light emitting diode (OLED) display device that includes one or more layers of organic light emitting elements disposed between a first electrode and a transparent second electrode; and a light-scattering layer deposited proximate at least a portion of the transparent second electrode, the light-scattering layer including at least one monolayer of light-scattering nanoparticles.

A method of manufacturing an OLED display device is provided. The method may include: disposing one or more layers of organic light emitting elements between a first electrode and a transparent second electrode; and depositing a light-scattering layer proximate at least a portion of the transparent second electrode, the light-scattering layer including at least one monolayer of light-scattering nanoparticles.

An electronic device is provided. The electronic device may include: a display, including: an organic light emitting diode (OLED) display device that includes one or more layers of organic light emitting elements disposed between a first electrode and a transparent second electrode; and a light-scattering layer deposited proximate at least a portion of the transparent second electrode, the light-scattering layer including at least one monolayer of light-scattering nanoparticles.

A system for manufacturing an organic light emitting diode display device is provided. The system may include: means for disposing one or more layers of organic light emitting elements between a first electrode and a transparent second electrode; and means for depositing a light-scattering layer proximate at least a portion of the transparent second electrode, the light-scattering layer including at least one monolayer of light-scattering nanoparticles.

Figures 1A, 1B:
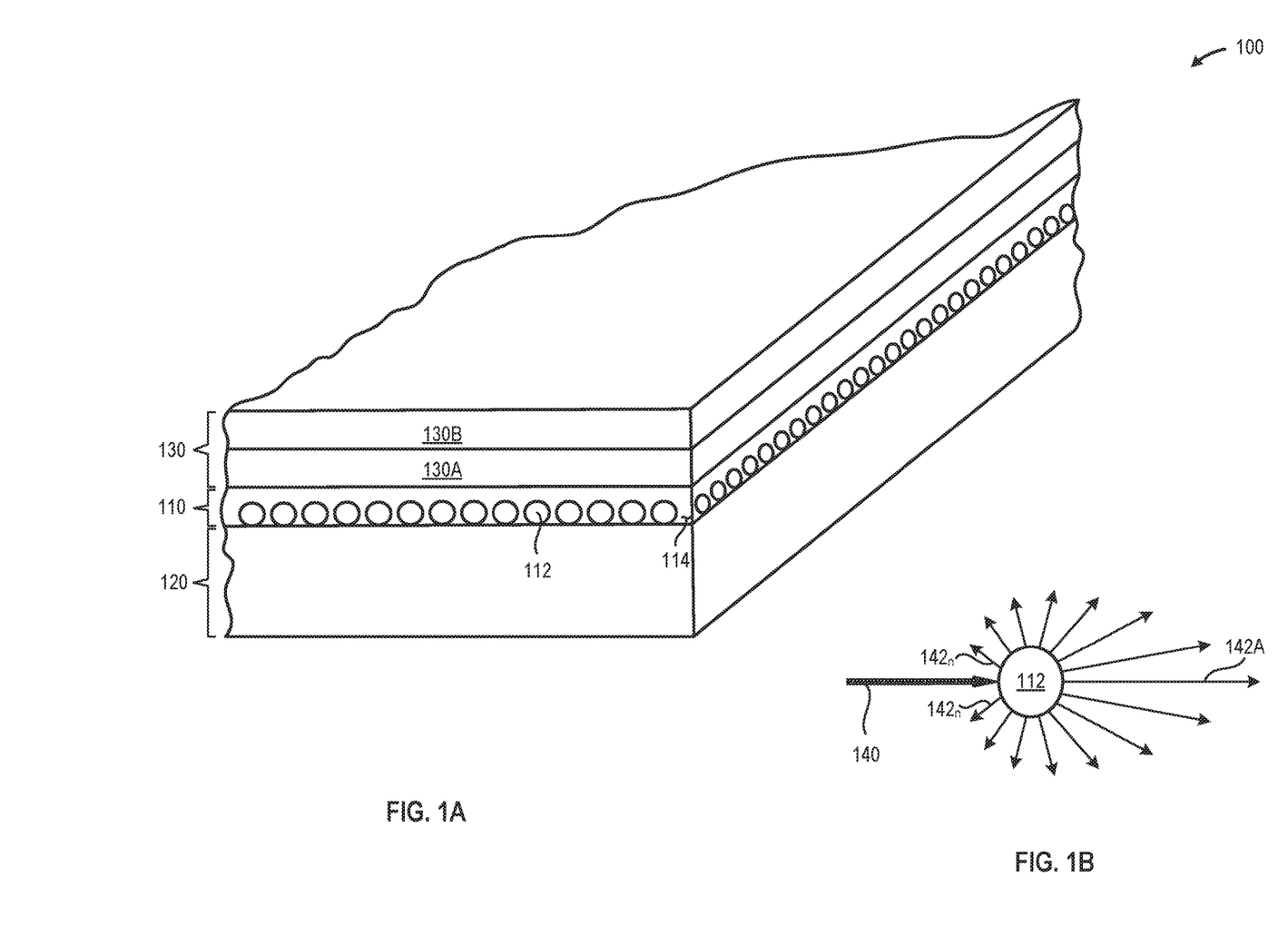
FIG. 1A is a perspective view of an illustrative OLED display device that includes a light-scattering layer having a plurality of nanostructures at least partially surrounded by an encapsulant, disposed between an OLED display layer, and a plurality of cover layers, in accordance with at least one embodiment described herein.
FIG. 1B is a schematic diagram of Mie scattering caused by each of the nanostructures included in the light-scattering layer, in accordance with at least one embodiment described herein.

FIG. 1A is a perspective view of an illustrative OLED display device 100 that includes a light-scattering layer 110 having a plurality of nanostructures 112 at least partially surrounded by an encapsulant 114, disposed between an OLED display layer 120, and a plurality of cover layers 130A, 130B (collectively, "cover layers 130"), in accordance with at least one embodiment described herein. FIG. 1B is a schematic diagram of Mie scattering caused by each of the nanostructures 112 included in the light-scattering layer 110. As depicted in FIG. 1B, the nanostructure 112 anisotropically scatters the incident electromagnetic energy 140 into a plurality of directions 142A-142n, with the greatest of the energy scattered in the direction 142A of the incident electromagnetic energy 140. As depicted in FIG. 1A, the nanostructures 112 may be disposed at least partially across the surface of the OLED display layer 120. The nanostructures 112 may include any number and/or combination of nanostructures having any size, shape, and/or physical geometry. The nanostructures 112 may be selected based at least in part on the wavelength of the electromagnetic energy emitted by the OLED display layer 120.

In operation, the OLED display layer 120 generates an electromagnetic energy output within at least a portion of the visible spectrum (i.e., wavelengths between about 390 nm to about 700 nm). The electromagnetic energy output of the OLED display layer 120 impinges upon the plurality of nanostructures 112. The plurality of nanostructures 112 causes Mie scattering of the incident electromagnetic energy. The presence of the light-scattering layer 110 beneficially improves the light extraction efficiency of the OLED display device 100 by altering the electromagnetic energy emission pattern from Lambertian to Super-Lambertian, thereby allowing a greater level of electromagnetic energy extraction at the cover film-air interface of the OLED display device 100.

The light-scattering layer 110 includes a monolayer of nanostructures 112 disposed between the OLED display layer 120 and one or more upper layer(s), such as one or more polarizer layers 130A and one or more cover film layers 130B. In embodiments, the monolayer of nanostructures 112 may be at least partially surrounded by one or more encapsulants 114. In embodiments, the monolayer of nanostructures 112 includes but is not limited to a monolayer that includes a plurality of nanostructures 112 having a uniform composition. In embodiments, the monolayer of nanostructures 112 includes but is not limited to a monolayer that includes a plurality of nanostructures 112 having a uniform physical geometry (spheres, rods, cubes, cylinders, etc.).

The plurality of nanoparticles 112 may be deposited as a monolayer across all or a portion of the surface of the OLED display layer 120 using any currently available or future developed deposition technology, system, method, or process. For example, in some embodiments, the plurality of nanoparticles 112 may be deposited as a monolayer across at least a portion of the surface of the OLED display layer 120 via atomic layer deposition or liquid phase atomic layer deposition. Other material deposition technologies, systems, methods, or processes, such as chemical vapor deposition, physical vapor deposition, electroplating, sputtering, electroless plating and similar may be used to deposit the plurality of nanoparticles 112 as a monolayer across at least a portion of the surface of the OLED display layer 120. In some embodiments, the plurality of nanoparticles 112 may be deposited as a pattern on, about, or across at least a portion of the surface of the OLED display layer 120 using any currently available or future developed subtractive manufacturing technique.

In embodiments, the nanoparticles 112 are deposited or otherwise disposed on, about, or across at least a portion of the surface of the OLED display layer 120 such that the nanoparticles achieve random physical orientations (e.g., orientations in which the principal axis of each of at least a portion of the nanoparticles are not aligned). In embodiments, the nanoparticles 112 are deposited or otherwise disposed on, about, or across at least a portion of the surface of the OLED display layer 120 such that a substantially uniform nanoparticle surface density is achieved across the surface of the OLED display layer 120. In embodiments, the nanoparticles 112 are deposited or otherwise disposed on, about, or across at least a portion of the surface of the OLED display layer 120 such that a non-uniform surface density is achieved. In some instances, the nanoparticles 112 are patterned on, about, or across at least a portion of the surface of the OLED display layer 120 such that a non-uniform surface density is achieved. In some embodiments, the non-uniform nanoparticle surface density may correspond to OLED pixels included in the OLED display layer (e.g., a different nanoparticle surface densities corresponding to red, green, and/or blue OLED pixels). In embodiments, the nanoparticles 112 are deposited or otherwise disposed on, about, or across at least a portion of the surface of the OLED display layer 120 such that a substantially uniform nanoparticle physical orientation is achieved. In embodiments, the nanoparticles 112 are deposited or otherwise disposed on, about, or across at least a portion of the surface of the OLED display layer 120 such that the physical orientation of the nanoparticles 112 selectively aligns with one or more structures included in the OLED display layer 120 (e.g., a first physical orientation corresponding to red OLED pixels; a second physical orientation corresponding to green OLED pixels, and a third physical orientation corresponding to blue OLED pixels).

The nanoparticles 112 included in the light-scattering layer 110 may have any composition and/or combination of compositions. Example compositions include but are not limited to: film with randomly distributed, high-index, nanostructures disposed proximate the OLED element layer. Example, non-limiting materials for use as nanoparticles 112 include but are not limited to: indium tin oxide (ITO), silicon nitride ($Si_3N_4$), calcium oxide (CaO), antimony oxide ($Sb_2O_3$), titanium oxide ($TiO_2$), zirconium oxide ($ZrO_2$), tantalum pentoxide ($Ta_2O_5$), hafnium oxide ($HfO_2$), niobium oxide ($Nb_2O_3$), magnesium oxide (MgO), zinc oxide (ZnO), indium oxide ($In_2O_3$), tin oxide ($Sn_2O_3$), aluminum nitride (AlN), gallium nitride (GaN), or any other high index materials on a substrate used in OLED fabrication or encapsulation. Subsequent application a low index coating, such as $SiO_2$, $Al_2O_3$, or polymeric materials over the nanoparticles provides the index contrast needed for scattering or diffraction efficiency and to planarize the surface. In embodiments, the plurality of nanoparticles 112 may have a uniform composition across all or a portion of the surface of the OLED display layer 120. In embodiments, the plurality of nanoparticles 112 may include nanoparticles having two or more different compositions. For example, nanoparticles having a first composition and/or physical configuration may be patterned or otherwise disposed proximate one or more structures (e.g., red, green, or blue OLED pixels) and nanoparticles having a second composition and/or physical configuration may be patterned or otherwise disposed proximate one or more structures (e.g., red, green, or blue OLED pixels).

In embodiments, the some or all of the nanoparticles 112 included in the light-scattering layer 110 may include transparent nanoparticles 112. In embodiments, some or all of the nanoparticles 112 included in the light-scattering layer 110 may include asymmetric nanoparticles 112. In embodiments, the light-scattering layer 110 may include randomly arranged, asymmetric, transparent nanoparticles 112.

In embodiments, the physical dimensions of each of some or all of the plurality of nanostructures 112 may be selected based on the wavelength of the electromagnetic energy generated by the OLED display layer 120 that falls incident upon the respective nanostructure(s) 112. In embodiments, the physical dimensions of each of some or all of the plurality of nanostructures may exceed 10% (i.e., $\frac{1}{10}$) of the wavelength of the incident electromagnetic energy generated by the OLED display layer 120 to achieve inelastic (i.e., anisotropic Mie scattering) of the incident electromagnetic energy generated by the OLED display layer 120. For example, each of the plurality of nanoparticles may have a principal physical dimension of from about 10 nanometers (nm) to about 150 micrometers ($\mu$m). In embodiments, each of the plurality of nanoparticles may have a principal physical dimension of: about 20% or more of the wavelength of incident electromagnetic energy (i.e., 0.22) or more; about 100% or more of the wavelength of incident electromagnetic energy (i.e., $\lambda$) or more; or about 1000% or more of the wavelength of incident electromagnetic energy (i.e., $10\lambda$) or more. In embodiments, the nanoparticles 112 may include generally spherical nanoparticles 112 having a diameter of about 1000 nanometers or less. In embodiments, the nanoparticles 112 may include generally spherical nanoparticles 112 having a diameter of from about 100 nanometers to about 600 nanometers. In embodiments, each of the plurality of nanoparticles 112 may have a substantially uniform refractive index. For example, the plurality of nanoparticles may have a refractive index of from about 1.0 to about 3.0. In embodiments, the light-scattering layer 110 may have a thickness of from about 50 nanometers (nm) to about 500 nm.

In embodiments, the encapsulant 114 may partially or completely surround the plurality of nanoparticles 112. In embodiments, the encapsulant 114 may include one or more materials substantially transparent to electromagnetic energy in the visible spectrum. In embodiments, the encapsulant 114 may include one or more materials having a refractive index that differs from the refractive index of the materials used to form the plurality of nanoparticles 112. In at least some implementations, the encapsulant 114 may have an index of refraction that is less than the index of refraction of the material forming at least some of the plurality of nanoparticles 112. The encapsulant may include one or more chemically or thermally curable materials. In embodiments, the encapsulant may be planarized prior to deposition of the one or more cover layers 130. In embodiments, the encapsulant 114 may include one or more dielectric or insulative materials.

The OLED display layer 120 includes any number and/or combination of currently available and/or future developed organic light emitting diode (OLED) sources capable of emitting electromagnetic energy in the visible spectrum. In addition, the OLED layer 120 includes the various electronic components, semiconductor devices, and/or logic elements to control the activation and illumination intensity of each pixels included in the OLED layer 120. In some embodiments, the OLED display layer 120 may include an anode layer, semiconductor (e.g., thin film transistor (TFT)) devices to selectively control the voltage applied to each of the OLED pixels, an OLED layer containing a number of OLED pixels, and a transparent cathode layer. In embodiments, the OLED display layer 120 may include either a passive matrix OLED (PMOLED), an active matrix OLED (AMOLED), or super AMOLED. The OLED display layer 120 may have any size and/or pixel count. For example, the OLED display layer 120 may have a pixel matrix size of: 1280×720 (720p); 1920×1080 (1080p, full HD); 2560×1440 (2K); 3840×2160 (4K Ultra); or 4096×2160 (True 4K). The pixels forming the OLED display layer 120 may be disposed in any physical configuration to provide a desired pixel density. For example, the pixels forming the OLED display layer 120 may be disposed in a physical configuration to provide a pixel density of: 300 pixels per inch (ppi) or greater; 400 ppi or greater; 500 ppi or greater; 750 ppi or greater; or 1000 ppi or greater. In embodiments, the OLED display layer 120 may include a hinged substrate to permit folding the OLED display device 100. In embodiments, the OLED display layer 120 may include a flexible substrate to permit folding the OLED display device 100.

The one or more cover layers 130 may include any number of layers having any composition. For example, the one or more cover layers 130 may include one or more polarizer layer 130A and/or more cover films 130B. Other cover layers 130 may include but are not limited to: one or more adhesive layers, one or more filter layers, one or more mask layers, or combinations thereof.

Figure 2:
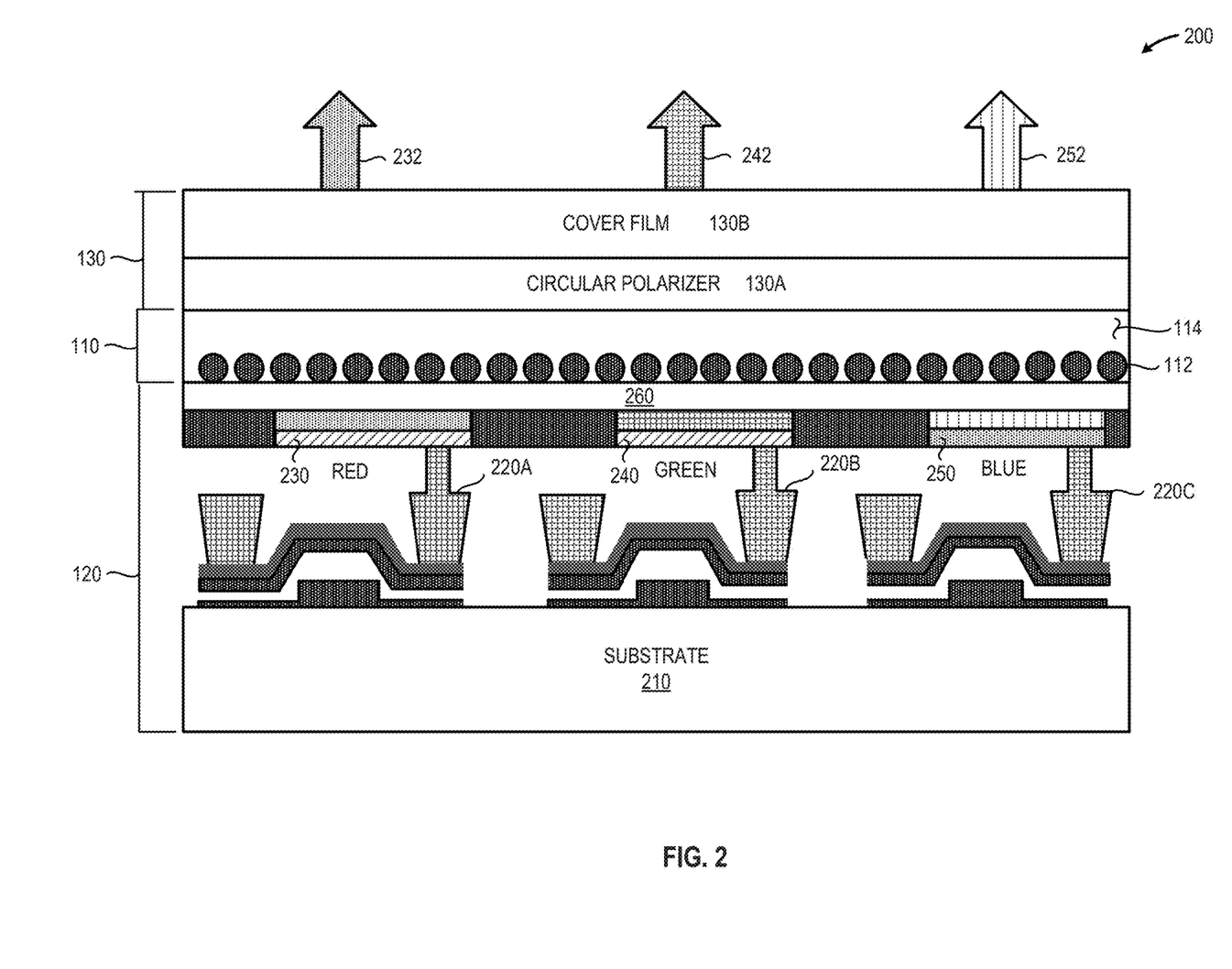
FIG. 2 depicts a cross-sectional elevation of an illustrative OLED display device incorporating a light-scattering layer that includes a plurality of nanoparticles arranged as a monolayer and disposed proximate at least a portion of the surface of the OLED display layer, in accordance with at least one embodiment described herein.

FIG. 2 depicts a cross-sectional elevation of an illustrative OLED display device 200 incorporating a light-scattering layer 110 that includes a plurality of nanoparticles 112 arranged as a monolayer and disposed proximate at least a portion of the surface of the OLED display layer 120, in accordance with at least one embodiment described herein. As depicted in FIG. 2, the OLED display layer may include a number of components including but not limited to: a substrate 210; TFT transistors 220A-220C; and a transparent cathode layer 260. As depicted in the embodiment in FIG. 2, TFT transistor 220A may control the operation of a red OLED display pixel 230 to produce a visible red output 232, TFT transistor 220B may control the operation of a green OLED display pixel 240 to produce a visible green output 242, and TFT transistor 220C may control the operation of a blue OLED display pixel 250 to produce a visible blue output 252. The substrate 210 may include a rigid substrate material, a flexible substrate material, a foldable substrate material, or combinations thereof. The TFT transistors 220 may be deposited; disposed, patterned, or otherwise formed on the surface of the substrate 210 using any currently available or future developed semiconductor device manufacturing process, method, or procedure.

The OLED display pixels 230, 240, and 250 may be disposed between the TFT transistors 220 and the transparent cathode layer. The OLED display pixels 230, 240, and 250 may include any currently available or future developed organic light emitting diode technology. The OLED display pixels 230, 240, and 250 may be deposited, disposed or otherwise patterned onto the substrate using any currently available or future developed deposition process, procedure, or method. Example deposition processes include but are not limited to: vacuum deposition, vacuum thermal evaporation, organic vapor phase deposition, and inkjet printing. The transparent cathode layer 260 may include one or more transparent, electrically conductive, materials such as indium tin oxide (ITO).

The light-scattering layer 110 includes a nanoparticle monolayer that includes a plurality of nanoparticles 112 disposed in one or more materials to form a thin-film encapsulant 114. The light-scattering layer 110 may be disposed, patterned, or otherwise distributed on, about, or across at least a portion of the upper surface of the OLED display layer 120. In embodiments, the upper surface of the OLED display layer 120 may be planarized or similarly finished prior to receiving the light-scattering layer 110. In embodiments, the light-scattering layer 110 may include nanoparticles 112 having a substantially uniform refractive index. For example, in some embodiments, the nanoparticles 112 may have a refractive index of from about 1.0 to about 3.0. In embodiments, the light-scattering layer 110 may have a thickness of from about 50 nanometers (nm) to about 500 nm.

The one or more cover layers 130 may include any number of layers having any composition. For example, the one or more cover layers 130 may include one or more polarizer layers 130A and/or more cover and/or protective films 130B. Other cover layers 130 may include but are not limited to: one or more adhesive layers, one or more filter layers, one or more mask layers, or combinations thereof.

Figure 3:
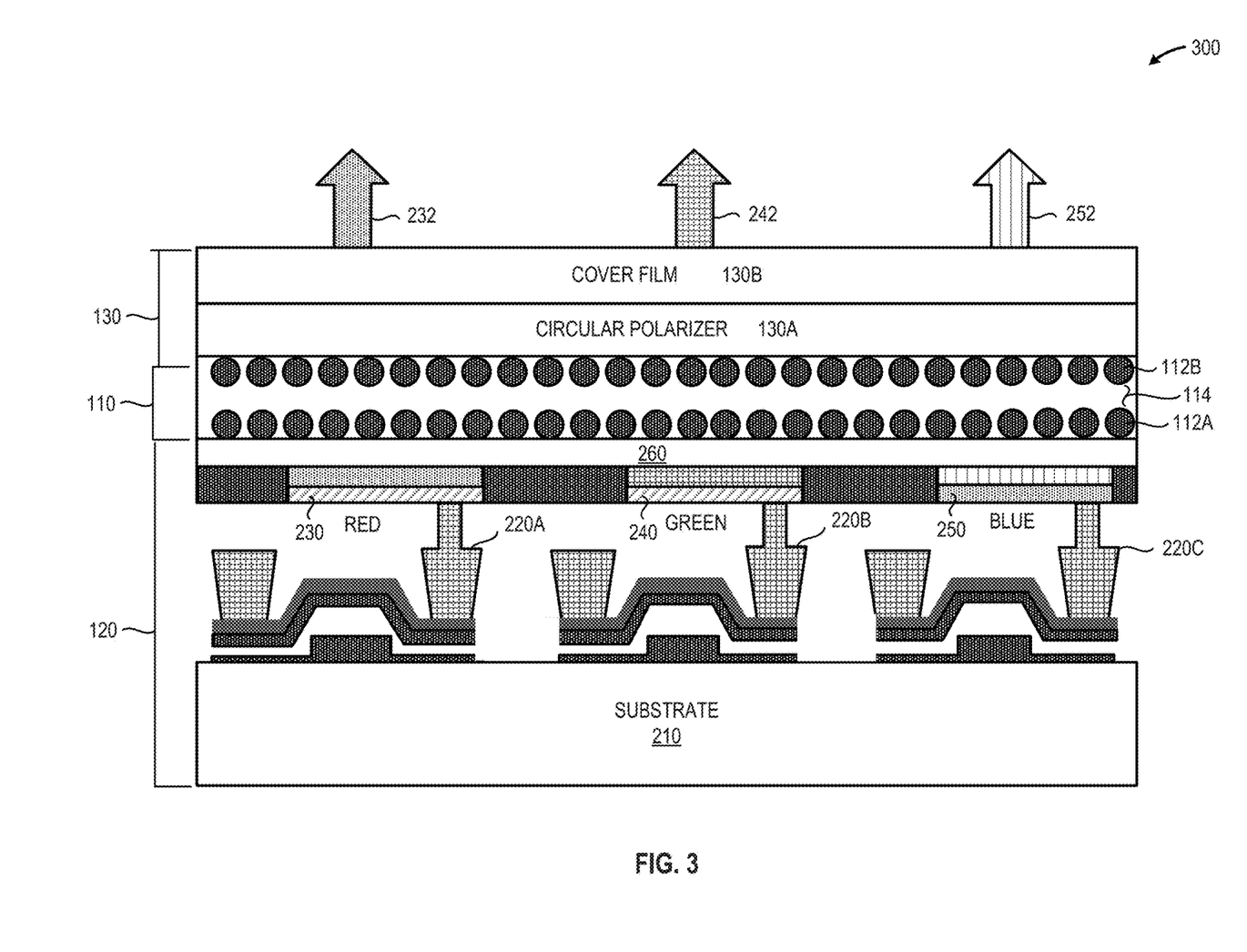
FIG. 3 depicts a cross-sectional elevation of an illustrative OLED display device incorporating a light-scattering layer that includes a first nanoparticle monolayer and a second nanoparticle monolayer disposed proximate at least a portion of the surface of the OLED display layer, in accordance with at least one embodiment described herein.

FIG. 3 depicts a cross-sectional elevation of an illustrative OLED display device 300 incorporating a light-scattering layer 110 that includes a first nanoparticle monolayer 112A and a second nanoparticle monolayer 112B disposed proximate at least a portion of the surface of the OLED display layer 120, in accordance with at least one embodiment described herein. As depicted in FIG. 3, the OLED display layer 120 may include a number of components including but not limited to: a substrate 210; TFT transistors 220A-220C; and a transparent cathode layer 260. As depicted in the embodiment in FIG. 2, TFT transistor 220A may control the operation of a red OLED display pixel 230, TFT transistor 220B may control the operation of a green OLED display pixel 240, and TFT transistor 220C may control the operation of a blue OLED display pixel 250. The substrate 210 may include a rigid substrate material, a flexible substrate material, a foldable substrate material, or combinations thereof. The TFT transistors 220 may be deposited; disposed, patterned, or otherwise formed on the surface of the substrate 210 using any currently available or future developed semiconductor device manufacturing process, method, or procedure. Although only two nanoparticle monolayers 112A, 112B are depicted in FIG. 3, those of skill in the relevant arts will readily appreciate that any number of nanoparticle monolayers 112A-112n may be similarly disposed on the surface of the OLED display layer 120.

The OLED display pixels 230, 240, and 250 may be disposed between the TFT transistors 220 and the transparent cathode layer. The OLED display pixels 230, 240, and 250 may include any currently available or future developed organic light emitting diode technology. The OLED display pixels 230, 240, and 250 may be deposited, disposed or otherwise patterned onto the substrate using any currently available or future developed deposition process, procedure, or method. Example deposition processes include but are not limited to: vacuum deposition, vacuum thermal evaporation, organic vapor phase deposition, and inkjet printing. The transparent cathode layer 260 may include one or more transparent, electrically conductive, materials such as indium tin oxide (ITO).

The light-scattering layer 110 includes a first nanoparticle monolayer 112A and a second nanoparticle monolayer 112B. The nanoparticles included in the first nanoparticle monolayer 112A may have the same or a different physical geometry than the nanoparticles include in the second nanoparticle monolayer 112B. The nanoparticles included in the first nanoparticle layer 112A may have the same or different composition than the nanoparticles included in the second nanoparticle layer 112B. In embodiments, all or a portion of the first nanoparticle monolayer 112A may be patterned on, about, or across at least a portion of the surface of the OLED display layer 110. In embodiments, all or a portion of the second nanoparticle monolayer 112B may be patterned on, about, or across at least a portion of the surface of the OLED display layer 110 and/or the first nanoparticle monolayer 112A. In embodiments, the first nanoparticle monolayer 112A and the second nanoparticle monolayer 112B may be complimentarily patterned on, about, or across all of a portion of the surface of the OLED display layer 120. For example, the first nanoparticle monolayer 112A and the second nanoparticle monolayer 112B may be complimentarily patterned in a checkerboard pattern on, about, or across at least a portion of the surface of the OLED display layer 120. In embodiments, the refractive index of the nanoparticles included in the first nanoparticle layer 112A may differ from the refractive index of the nanoparticles included in the second nanoparticle layer 112B.

In embodiments, all or a portion of the first nanoparticle layer 112A and all or a portion of the second nanoparticle layer 112B may be at least partially disposed in one or more materials forming a thin-film encapsulant 114. The light-scattering layer 110 may be disposed, patterned, or otherwise distributed on, about, or across at least a portion of the upper surface of the OLED display layer 120. In embodiments, the upper surface of the OLED display layer 120 may be planarized or similarly finished prior to receiving the light-scattering layer 110. In embodiments, the light-scattering layer 110 may have a thickness of from about 50 nanometers (nm) to about 500 nm.

The one or more cover layers 130 may include any number of layers having any composition. For example, the one or more cover layers 130 may include one or more polarizer layers 130A and/or more cover and/or protective films 130B. Other cover layers 130 may include but are not limited to: one or more adhesive layers, one or more filter layers, one or more mask layers, or combinations thereof.

Figure 4:
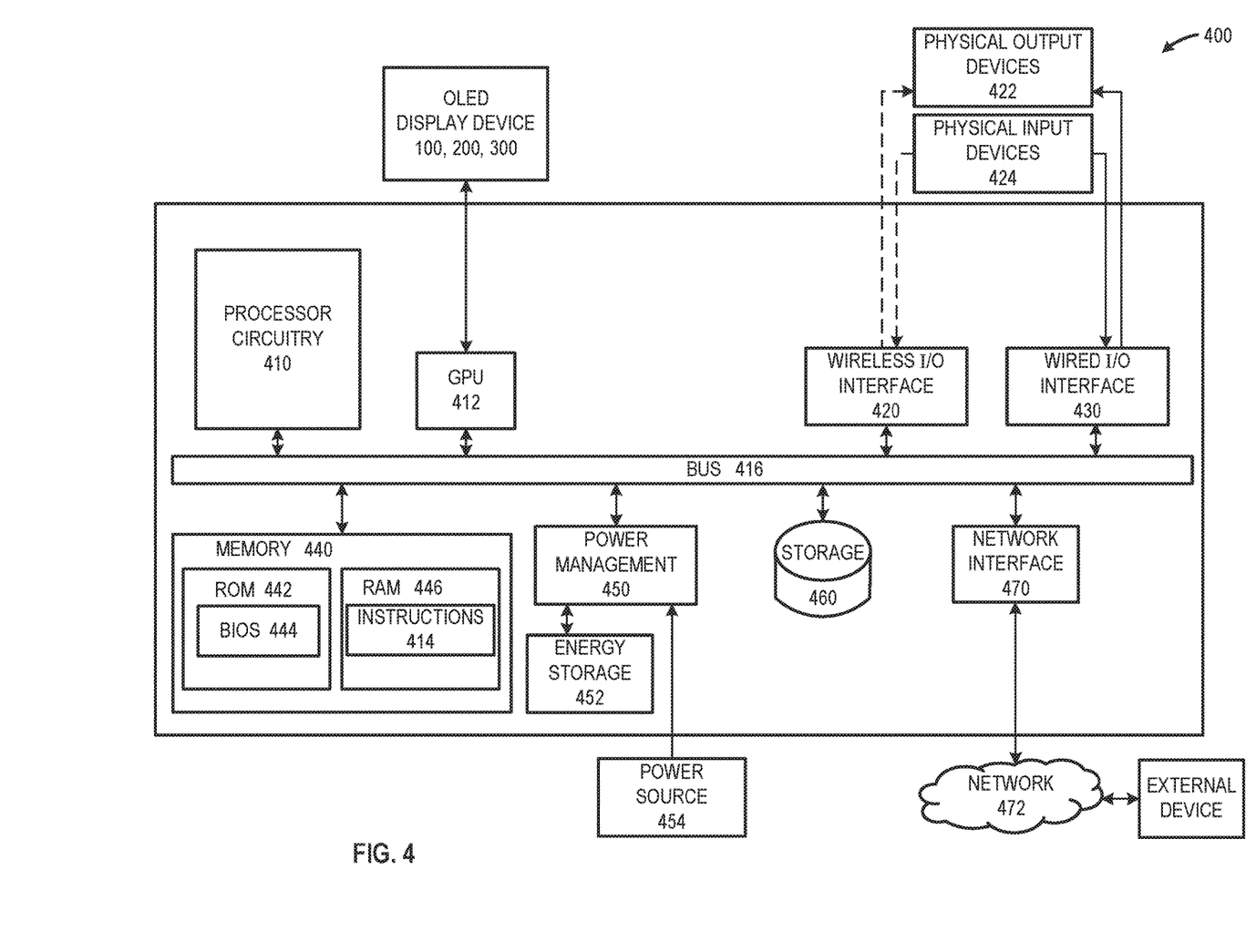
FIG. 4 is a schematic diagram of an illustrative electronic, processor-based, device that includes an OLED display device incorporating a light-scattering layer such as described above in FIGS. 1, 2, and 3, in accordance with at least one embodiment described herein.

FIG. 4 is a schematic diagram of an illustrative electronic, processor-based, device 400 that includes an OLED display device 100 incorporating a light-scattering layer 110 such as described above in FIGS. 1, 2, and 3, in accordance with at least one embodiment described herein. The processor-based device 400 may additionally include one or more of the following: a graphical processing unit 412, wireless input/output (I/O) interface circuitry 420, wired I/O interface circuitry 430, system memory circuitry 440, power management circuitry 450, one or more non-transitory storage devices 460, and network interface circuitry 470. The following discussion provides a brief, general description of the components forming the illustrative processor-based device 400. Example, non-limiting processor-based devices 400 may include, but are not limited to: smartphones, wearable computers, portable computing devices, handheld computing devices, desktop computing devices, blade server devices, workstations, and similar. The OLED display device 100 may include a rigid display device, a flexible display device, a foldable display device, or any combination thereof.

In some embodiments, the processor-based device 400 includes graphics processor circuitry 412 capable of executing machine-readable instruction sets and generating an output signal capable of providing a display output to a system user. Those skilled in the relevant art will appreciate that the illustrated embodiments as well as other embodiments may be practiced with other processor-based device configurations, including portable electronic or handheld electronic devices, for instance smartphones, portable computers, wearable computers, consumer electronics, personal computers ("PCs"), network PCs, minicomputers, server blades, mainframe computers, and the like. The processor circuitry 410 may include any number of hardwired or configurable circuits, some or all of which may include programmable and/or configurable combinations of electronic components, semiconductor devices, and/or logic elements that are disposed partially or wholly in a PC, server, or other computing system capable of executing machine-readable instructions.

The processor-based device 400 includes a bus or similar communications link 416 that communicably couples and facilitates the exchange of information and/or data between various system components including the processor circuitry 410, the graphics processor circuitry 412, the wireless I/O interface circuitry 420, the wired I/O interface circuitry 430, the system memory circuitry 440, the power management circuitry 450, the one or more non-transitory storage devices 460, and/or the network interface circuitry 470. The processor-based device 400 may be referred to in the singular herein, but this is not intended to limit the embodiments to a single processor-based device 400, since in certain embodiments, there may be more than one processor-based device 400 that incorporates, includes, or contains any number of communicably coupled, collocated, or remote networked circuits or devices.

The processor circuitry 410 may include any number, type, or combination of currently available or future developed devices capable of executing machine-readable instruction sets. The processor circuitry 410 may include but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 4 are of conventional design. Consequently, such blocks need not be described in further detail herein, as they will be understood by those skilled in the relevant art. The bus 416 that interconnects at least some of the components of the processor-based device 400 may employ any currently available or future developed serial or parallel bus structures or architectures.

The system memory circuitry 440 may include read-only memory ("ROM") circuitry 442 and random access memory ("RAM") circuitry 446. A portion of the ROM circuitry 442 may be used to store or otherwise retain a basic input/output system ("BIOS") 444. The BIOS 444 provides basic functionality to the processor-based device 400, for example by causing the processor circuitry 410 to load and/or execute one or more machine-readable instruction sets, such as the operating system instructions, and/or one or more applications. In embodiments, at least some of the one or more machine-readable instruction sets cause at least a portion of the processor circuitry 410 to provide, create, produce, transition, and/or function as a dedicated, specific, and particular machine, for example a word processing machine, a digital image acquisition machine, a media playing machine, a gaming system, a communications device, a smartphone, or similar. In embodiments, the RAM circuitry 446 may include all or a portion of the system memory circuitry 440.

The processor-based device 400 includes wireless input/output (I/O) interface circuitry 420. The wireless I/O interface circuitry 420 may be communicably coupled to one or more physical output devices 422 (tactile devices, video displays, audio output devices, hardcopy output devices, etc.). The wireless I/O interface circuitry 420 may communicably couple to one or more physical input devices 424 (pointing devices, touchscreens, keyboards, tactile devices, etc.). The wireless I/O interface circuitry 420 may include any currently available or future developed wireless I/O interface circuitry. Example wireless I/O interface circuitry 420 may include but is not limited to: BLUETOOTH®, near field communication (NFC), and similar.

The processor-based device 400 may include wired input/output (I/O) circuitry 430. The wired I/O interface circuitry 430 may be communicably coupled to one or more physical output devices 422 (tactile devices, video displays, audio output devices, hardcopy output devices, etc.). The wired I/O interface circuitry 430 may be communicably coupled to one or more physical input devices 424 (pointing devices, touchscreens, keyboards, tactile devices, etc.). The wired I/O interface circuitry 430 may include any currently available or future developed I/O interface. Example wired I/O interface circuitry 430 may include but is not limited to: universal serial bus (USB), IEEE 1394 ("FireWire"), and similar.

The processor-based device 400 may include one or more communicably coupled, non-transitory, data storage devices 460. The non-transitory data storage device 460 may include one or more hard disk drives (HDDs) and/or one or more solid-state storage devices (SSDs). The non-transitory data storage device 460 may include any current or future developed storage appliances, network storage devices, and/or systems. Non-limiting examples of such non-transitory data storage devices 460 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the non-transitory data storage devices 460 may include one or more removable storage devices, such as one or more flash drives, flash memories, flash storage units, or similar appliances or devices capable of communicable coupling to and decoupling from the processor-based device 400.

The non-transitory data storage device 460 may include interfaces or controllers (not shown) communicatively coupling the respective storage device or system to the bus 416. The non-transitory data storage device 460 may store, retain, or otherwise contain machine-readable instruction sets, data structures, program modules, data stores, databases, logical structures, and/or other data useful to the processor circuitry 410 and/or graphics processor circuitry 412 and/or one or more applications executed on or by the processor circuitry 410 and/or graphics processor circuitry 412. In some instances, the non-transitory data storage device 460 may be communicably coupled to the processor circuitry 410, for example via the bus 416 or via the wired communications interface circuitry 430 (e.g., Universal Serial Bus or USB); the wireless communications interface circuitry 420 (e.g., Bluetooth®, Near Field Communication or NFC); and/or the network interface circuitry 470 (IEEE 802.3 or Ethernet, IEEE 802.11, or WiFi®, etc.).

The non-transitory data storage device 460 stores all or a portion of the instructions executed, at least in part, by the processor circuitry 410. The non-transitory data storage device 460 may store, include, or otherwise retain operating system instructions. The operating system instructions may include but are not limited to any version up to the latest release of: Windows®; OSx®; iOS®; Android®; Linux®; and similar. The non-transitory data storage device 460 may store, include, or otherwise retain application instructions executed by the processor circuitry 410. Such applications may include but are not limited to: productivity software; communications software; entertainment software; audio and/or video playback software; or similar.

The processor-based device 400 may include power management circuitry 450 that controls one or more operational aspects of the energy storage device 452. In embodiments, the energy storage device 452 may include one or more primary (i.e., non-rechargeable) or secondary (i.e., rechargeable) batteries or similar energy storage devices. In embodiments, the energy storage device 452 may include one or more supercapacitors or ultracapacitors. In embodiments, the power management circuitry 450 may alter, adjust, or control the flow of energy from an external power source 454 to the energy storage device 452 and/or to the processor-based device 400. The power source 454 may include, but is not limited to, a solar power system, a commercial electric grid, a portable generator, an external energy storage device, or any combination thereof.

For convenience, the processor circuitry 410, the graphics processor circuitry 412, the wireless I/O interface circuitry 420, the wired I/O interface circuitry 430, the system memory circuitry 440, the power management circuitry 450, the non-transitory data storage device 460, and the network interface circuitry 470 are illustrated as communicatively coupled to each other via the bus 416, thereby providing connectivity between the above-described components. In alternative embodiments, the above-described components may be communicatively coupled in a different manner than illustrated in FIG. 4. For example, one or more of the above-described components may be directly coupled to other components, or may be coupled to each other, via one or more intermediary components (not shown). In another example, one or more of the above-described components may be integrated into the processor circuitry 410 and/or the graphics processor circuitry 412. In some embodiments, all or a portion of the bus 416 may be omitted and the components are coupled directly to each other using suitable wired or wireless connections.

Figure 5:
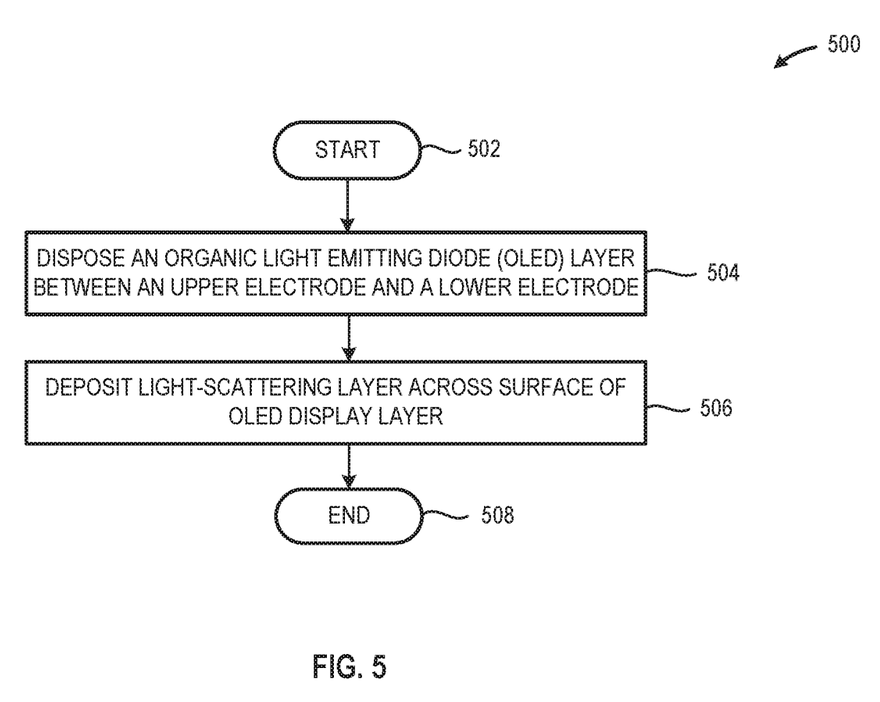
FIG. 5 is a high-level flow diagram of an illustrative method of producing an OLED display device that includes a light-scattering layer that beneficially improves display output and advantageously reduces power consumption, in accordance with at least one embodiment described herein.

FIG. 5 is a high-level flow diagram of an illustrative method 500 of producing an OLED display device that includes a light-scattering layer 110 that beneficially improves display output and advantageously reduces power consumption, in accordance with at least one embodiment described herein. The OLED display device includes a plurality of organic light emitting diode picture elements, the voltage to each controlled using a respective TFT transistor 220 disposed between an anode and a transparent cathode layer. The light-scattering layer 110 is disposed between the OLED display layer 120 and the device user to improve the output of electromagnetic energy in the visible spectrum. The method 500 commences at 502.

At 504, an organic light emitting diode layer is disposed between an anode layer and a transparent cathode layer to form an OLED structure. The OLED structure is formed on a substrate 210. The substrate 210 may include a rigid substrate, a flexible substrate, a foldable substrate or any combination thereof. The OLED display layer 120 includes the substrate 210, the anode, that transparent cathode layer, and the OLED structure. In embodiments, the OLED display layer 120 may include a generally planar member having an upper surface and a transversely opposed lower surface.

At 506, a light-scattering layer 110 is disposed, deposited, patterned, or otherwise formed on, across or about at least a portion of the upper surface of the OLED display layer 120. In embodiments, the light-scattering layer 110 may include one or more nanostructure monolayers 112A-112n at least partially surrounded by an encapsulant 114. In embodiments, the light scattering layer 110 may include nanostructures 112 patterned on, across, or about the upper surface of the OLED display layer 120. In some implementations, the light scattering layer 110 may include nanoparticles having two or more different refractive indices. In such implementations, the nanoparticles 112 having differing refractive indices may be randomly disposed or selectively patterned across the upper surface of the OLED display layer 120. In some implementations, the light-scattering layer 110 may include nanoparticles 112 having at least two different physical geometries. In such implementations, the nanoparticles 112 having differing physical geometries may be randomly disposed or selectively patterned across the upper surface of the OLED display layer 120. In embodiments, the light-scattering layer 110 may have a thickness of from about 50 nanometers to about 500 nanometers. The method 500 concludes at 508.

Figure 6:
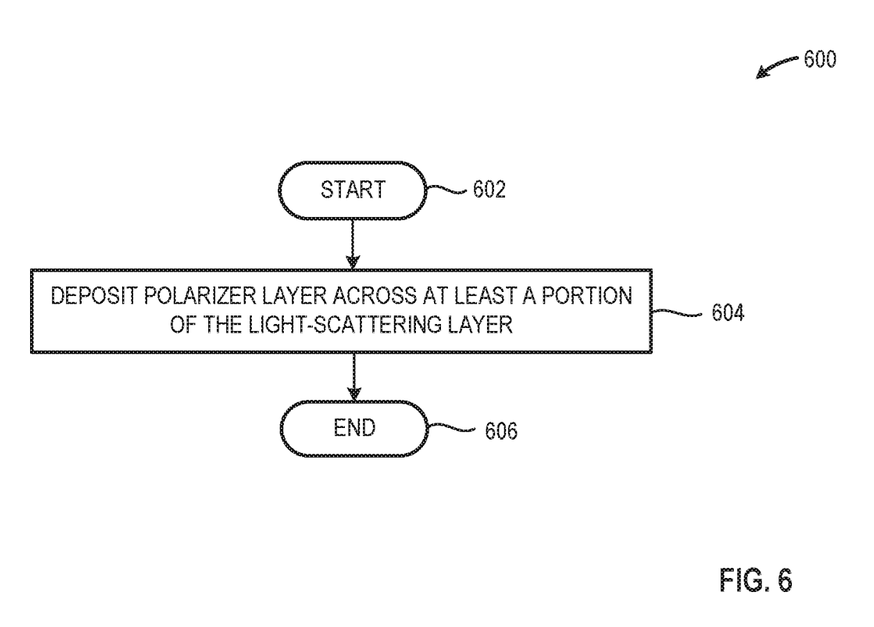
FIG. 6 is a high-level flow diagram of an illustrative method of forming an OLED display device that includes a light-scattering layer, in accordance with at least one embodiment described herein.

FIG. 6 is a high-level flow diagram of an illustrative method 600 of forming an OLED display device that includes a light-scattering layer 110, in accordance with at least one embodiment described herein. The method 600 may be used in conjunction with the method 500 described in detail above. The method 600 commences at 602.

At 604, a polarizer layer 130A may be disposed at least partially on, about, or across at least a portion of the light-scattering layer 110. In embodiments, the polarizer layer 130A may include a circular polarizer later. The method 600 concludes at 606.

Figure 7:
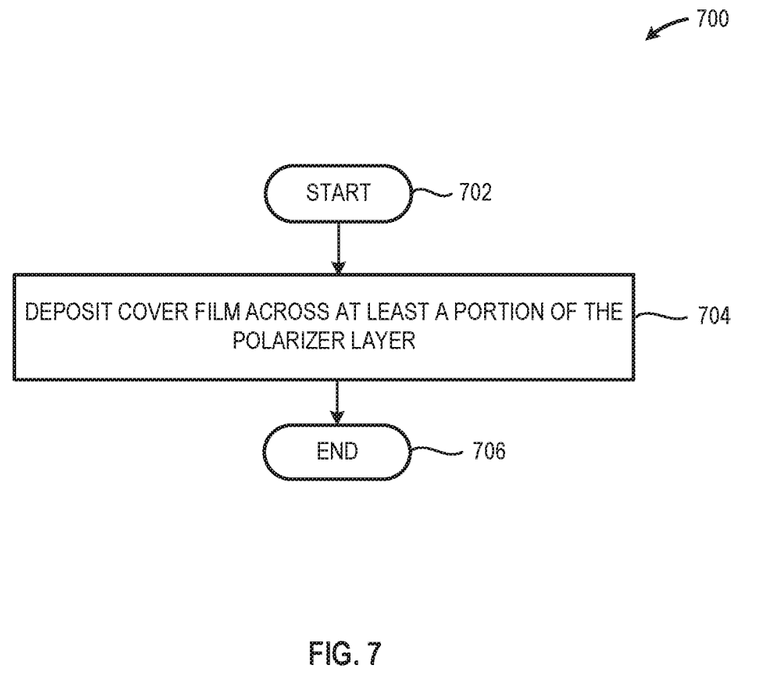
FIG. 7 is a high-level flow diagram of an illustrative method of forming an OLED display device that includes a light-scattering layer, in accordance with at least one embodiment described herein.

FIG. 7 is a high-level flow diagram of an illustrative method 700 of forming an OLED display device that includes a light-scattering layer 110, in accordance with at least one embodiment described herein. The method 700 may be used in conjunction with the method 500 and/or the method 600, both described in detail above. The method 700 commences at 702.

At 704, a cover and/or protective film 130B may be disposed at least partially on, about, or across at least a portion of the polarizer layer 130A. The method 700 concludes at 706.

While FIGS. 5, 6, and 7 illustrate various operations according to one or more embodiments, it is to be understood that not all of the operations depicted in FIGS. 5, 6, and 7 are necessary for other embodiments. Indeed, it is fully contemplated herein that in other embodiments of the present disclosure, the operations depicted in FIGS. 5, 6, and 7, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices.

As used in any embodiment herein, the term "circuitry" may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods of improving the efficiency and reducing the power consumption of organic light emitting diode (OLED) display devices. The OLED display device includes an OLED display layer that includes a substrate, an anode layer, a transparent cathode layer, and a plurality of OLED display pixels disposed between the anode and the cathode layers. A light-scattering layer is selectively or randomly disposed on, across, or about at least a portion of the surface of the OLED display layer. The light-scattering layer includes one or more monolayers, each of which includes a plurality of nanoparticles.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for detecting side-channel attacks on a system using KASLR by detecting TLB misses and determining whether a physical memory address corresponding to the virtual memory address causing the TLB miss contains a privileged object or a secret object.

According to example 1, there is provided a display apparatus. The display apparatus may include: an organic light emitting diode (OLED) display device that includes one or more layers of organic light emitting elements disposed between a first electrode and a transparent second electrode; and a light-scattering layer deposited proximate at least a portion of the transparent second electrode, the light-scattering layer including at least one monolayer of light-scattering nanoparticles.

Example 2 may include elements of example 1 where the at least one monolayer of light-scattering nanoparticles comprises a monolayer of light-scattering nanoparticles having a first index of refraction disposed across at least a portion of the transparent second electrode.

Example 3 may include elements of any of examples 1 or 2 where the light-scattering nanoparticles comprise transparent light-scattering nanoparticles.

Example 4 may include elements of any of examples 1 through 3 where the light-scattering nanoparticles comprise asymmetric, transparent, light-scattering nanoparticles.

Example 5 may include elements of any of examples 1 through 4 where the first monolayer of light-scattering nanoparticles comprises a monolayer of randomly oriented, asymmetric, transparent, light-scattering nanoparticles.

Example 6 may include elements of any of examples 1 through 5 where the at least one monolayer comprises a first monolayer of light-scattering nanoparticles optically coupled to the transparent second electrode.

Example 7 may include elements of any of examples 1 through 6 where the light-scattering nanoparticles comprise generally spherical light-scattering nanoparticles having a diameter of less than 1000 nanometers (nm).

Example 8 may include elements of any of examples 1 through 7 where the light-scattering nanoparticles comprise generally spherical light-scattering nanoparticles having a diameter of between 100 nanometers (nm) and 600 nm.

Example 9 may include elements of any of examples 1 through 8 where the light-scattering nanoparticles include at least one of: rutile particles, silicon nitride ($Si_3N_4$), titanium dioxide (TiO2), magnesium oxide (MgO), zinc oxide (ZnO), aluminum oxide ($Al_2O_3$), silicon oxide ($SiO_2$), indium oxide ($In_2O_3$), magnesium fluoride ($MgF_2$), hafnium oxide ($HfO_2$), zirconium oxide ($ZrO_2$), zirconium silicate ($ZrSiO_4$).

Example 10 may include elements of any of examples 1 through 9, and the display apparatus may further include: an encapsulant layer disposed across at least a portion of the light-scattering layer, the encapsulant having a second index of refraction, the second index of refraction less than the first index of refraction of the light-scattering nanoparticles.

Example 11 may include elements of any of examples 1 through 10, and the display apparatus may further include: a circular polarizer layer disposed proximate and at least partially across the encapsulant layer.

Example 12 may include elements of any of examples 1 through 11, and the display device may further include: a cover film layer disposed proximate and at least partially across the circular polarizer layer.

Example 13 may include elements of any of examples 1 through 12 where the cover film includes a first surface and a second surface, the first disposed proximate the circular polarizer layer and the second surface includes a textured surface.

Example 14 may include elements of any of examples 1 through 13 where the cover film comprises a titanium dioxide ($TiO_2$) monolayer proximate the surface of the cover film.

Example 15 may include elements of any of examples 1 through 14 where the at least one monolayer of light-scattering nanoparticles comprises: a first monolayer of light-scattering nanoparticles deposited proximate at least a portion of the transparent second electrode; and a second monolayer of light-scattering nanoparticles deposited proximate at least a portion of the first monolayer of light-scattering nanoparticles.

Example 16 may include elements of any of examples 1 through 15 where the first monolayer of light-scattering nanoparticles includes nanoparticles having a first physical geometry; and where the second monolayer of light-scattering nanoparticles includes nanoparticles having a second physical geometry, the second physical geometry different than the first physical geometry.

Example 17 may include elements of any of examples 1 through 16 where the first monolayer comprises generally spherical nanoparticles having a diameter of from about 100 nanometers (nm) to about 600 nm; and where the second monolayer comprises generally spherical nanoparticles having a diameter of from about 100 nanometers (nm) to about 600 nm.

According to example 18, there is provided a method of manufacturing an organic light emitting diode display device. The method may include: disposing one or more layers of organic light emitting elements between a first electrode and a transparent second electrode; and depositing a light-scattering layer proximate at least a portion of the transparent second electrode, the light-scattering layer including at least one monolayer of light-scattering nanoparticles.

Example 19 may include elements of example 18 where depositing the light-scattering layer proximate at least the portion of the transparent second electrode further comprises: depositing a monolayer of light-scattering nanoparticles having a first index of refraction proximate at least a portion of the transparent second electrode.

Example 20 may include elements of any of examples 18 or 19 where depositing the monolayer of light-scattering nanoparticles having the first index of refraction proximate at least the portion of the transparent second electrode further comprises: depositing a monolayer of transparent light-scattering nanoparticles having a first index of refraction proximate at least a portion of the transparent second electrode.

Example 21 may include elements of any of examples 18 through 20 where depositing a monolayer of transparent light-scattering nanoparticles having a first index of refraction proximate at least a portion of the transparent second electrode further comprises: depositing a monolayer of asymmetric, transparent, light-scattering nanoparticles having a first index of refraction proximate at least a portion of the transparent second electrode.

Example 22 may include elements of any of examples 18 through 21 where depositing the monolayer of asymmetric, transparent, light-scattering nanoparticles having the first index of refraction proximate at least the portion of the transparent second electrode further comprises: depositing a monolayer of randomly oriented, asymmetric, transparent, light-scattering nanoparticles having the first index of refraction proximate at least the portion of the transparent second electrode.

Example 23 may include elements of any of examples 18 through 22, and the method may further include: optically coupling the at least one monolayer of light-scattering nanoparticles to the transparent second electrode.

Example 24 may include elements of any of examples 18 through 23 where depositing the light-scattering layer proximate at least the portion of the transparent second electrode further comprises: depositing a light-scattering layer that includes generally spherical, light-scattering, nanoparticles having a diameter of less than 1000 nanometers (nm) proximate at least the portion of the transparent second electrode.

Example 25 may include elements of any of examples 18 through 24 where depositing the light-scattering layer that includes generally spherical light-scattering nanoparticles having a diameter of less than 1000 nanometers (nm) proximate at least the portion of the transparent second electrode further comprises: depositing a light-scattering layer that includes generally spherical, light-scattering, nanoparticles having a diameter of between 100 nanometers (nm) and 600 nm proximate at least the portion of the transparent second electrode.

Example 26 may include elements of any of examples 18 through 25 where depositing the light-scattering layer proximate at least the portion of the transparent second electrode further comprises: depositing a light-scattering layer proximate at least the portion of the transparent second electrode, the light-scattering layer including a monolayer of light-scattering nanoparticles that includes at least one of: rutile particles, silicon nitride ($Si_3N_4$), titanium dioxide (TiO2), magnesium oxide (MgO), zinc oxide (ZnO), aluminum oxide ($Al_2O_3$), silicon oxide ($SiO_2$), indium oxide ($In_2O_3$), magnesium fluoride ($MgF_2$), hafnium oxide ($HfO_2$), zirconium oxide ($ZrO_2$), zirconium silicate ($ZrSiO_4$).

Example 27 may include elements of any of examples 18 through 26, and the method may further include: depositing an encapsulant layer proximate at least a portion of the light-scattering layer, the encapsulant having a second index of refraction, the second index of refraction less than the first index of refraction of the light-scattering nanoparticles.

Example 28 may include elements of any of examples 18 through 27, and the method may further include: depositing a circular polarizer layer proximate at least a portion of the encapsulant layer.

Example 29 may include elements of any of examples 18 through 28, and the method may further include: depositing a cover film layer proximate at least a portion of the circular polarizer layer.

Example 30 may include elements of any of examples 18 through 29 where depositing the cover film layer proximate at least a portion of the circular polarizer layer further comprises: depositing a cover film that includes a first surface and a second surface proximate at least a portion of the circular polarizer layer, the first surface disposed proximate the circular polarizer layer and the second surface includes a textured surface.

Example 31 may include elements of any of examples 18 through 30 where depositing a light-scattering layer proximate at least a portion of the transparent second electrode, the light-scattering layer including at least one monolayer of light-scattering nanoparticles comprises:

depositing a light-scattering layer proximate at least a portion of the transparent second electrode, the light-scattering layer including: a first monolayer of light-scattering nanoparticles deposited proximate at least a portion of the transparent second electrode; and a second monolayer of light-scattering nanoparticles deposited proximate at least a portion of the first monolayer of light-scattering nanoparticles.

Example 32 may include elements of any of examples 18 through 31 where depositing the first monolayer of light-scattering nanoparticles proximate at least a portion of the transparent second electrode comprises: depositing a first monolayer of light-scattering nanoparticles that includes nanoparticles having a first physical geometry; and where depositing the second monolayer of light-scattering nanoparticles proximate at least a portion of the first monolayer of light-scattering nanoparticles comprises depositing a monolayer of light-scattering nanoparticles that includes nanoparticles having a second physical geometry, the second physical geometry different than the first physical geometry.

Example 33 may include elements of any of examples 18 through 32 where depositing a first monolayer of light-scattering nanoparticles that includes nanoparticles having a first physical geometry comprises: depositing a first monolayer that includes generally spherical nanoparticles having a diameter of from about 100 nanometers (nm) to about 600 nm; and depositing a second monolayer that includes generally spherical nanoparticles having a diameter of from about 100 nanometers (nm) to about 600 nm.

Example 34 may include elements of any of example 18 through 33 where depositing a light-scattering layer proximate at least a portion of the transparent second electrode comprises: depositing, via liquid phase atomic layer deposition, the light-scattering layer proximate at least the portion of the transparent second electrode.

According to example 35, there is provided an electronic device. The electronic device may include: a display, including: an organic light emitting diode (OLED) display device that includes one or more layers of organic light emitting elements disposed between a first electrode and a transparent second electrode; and a light-scattering layer deposited proximate at least a portion of the transparent second electrode, the light-scattering layer including at least one monolayer of light-scattering nanoparticles.

Example 36 may include elements of 35 where the at least one monolayer of light-scattering nanoparticles comprises a monolayer of light-scattering nanoparticles having a first index of refraction disposed across at least a portion of the transparent second electrode.

Example 37 may include elements of any of examples 35 or 36 where the light-scattering nanoparticles comprise transparent light-scattering nanoparticles.

Example 38 may include elements of any of examples 35 through 37 where the light-scattering nanoparticles comprise asymmetric, transparent, light-scattering nanoparticles.

Example 39 may include elements of any of examples 35 through 38 where the first monolayer of light-scattering nanoparticles comprises a monolayer of randomly oriented, asymmetric, transparent, light-scattering nanoparticles.

Example 40 may include elements of any of examples 35 through 39 where the at least one monolayer comprises a first monolayer of light-scattering nanoparticles optically coupled to the transparent second electrode.

Example 41 may include elements of any of examples 35 through 40 where the light-scattering nanoparticles comprise generally spherical light-scattering nanoparticles having a diameter of less than 1000 nanometers (nm).

Example 42 may include elements of any of examples 35 through 41 where the light-scattering nanoparticles comprise generally spherical light-scattering nanoparticles having a diameter of between 100 nanometers (nm) and 600 nm.

Example 43 may include elements of any of examples 35 through 42 where the light-scattering nanoparticles include at least one of: rutile particles, silicon nitride ($Si_3N_4$), titanium dioxide (TiO2), magnesium oxide (MgO), zinc oxide (ZnO), aluminum oxide ($Al_2O_3$), silicon oxide ($SiO_2$), indium oxide ($In_2O_3$), magnesium fluoride ($MgF_2$), hafnium oxide ($HfO_2$), zirconium oxide ($ZrO_2$), zirconium silicate ($ZrSiO_4$).

Example 44 may include elements of any of examples 35 through 43, and the electronic device may further include: an encapsulant layer disposed across at least a portion of the light-scattering layer, the encapsulant having a second index of refraction, the second index of refraction less than the first index of refraction of the light-scattering nanoparticles.

Example 45 may include elements of any of examples 35 through 44, and the electronic device may further include: a circular polarizer layer disposed proximate and at least partially across the encapsulant layer.

Example 46 may include elements of any of examples 35 through 45, and the electronic device may further include: a cover film layer disposed proximate and at least partially across the circular polarizer layer.

Example 47 may include elements of any of examples 35 through 46 where the cover film includes a first surface and a second surface, the first disposed proximate the circular polarizer layer and the second surface includes a textured surface.

Example 48 may include elements of any of examples 35 through 47 where the cover film comprises a titanium dioxide ($TiO_2$) monolayer proximate the surface of the cover film.

Example 49 may include elements of any of examples 35 through 48 where the at least one monolayer of light-scattering nanoparticles comprises: a first monolayer of light-scattering nanoparticles deposited proximate at least a portion of the transparent second electrode; and a second monolayer of light-scattering nanoparticles deposited proximate at least a portion of the first monolayer of light-scattering nanoparticles.

Example 50 may include elements of any of examples 35 through 49 where the first monolayer of light-scattering nanoparticles includes nanoparticles having a first physical geometry; and where the second monolayer of light-scattering nanoparticles includes nanoparticles having a second physical geometry, the second physical geometry different than the first physical geometry.

Example 51 may include elements of any of examples 35 through 59 where the first monolayer comprises generally spherical nanoparticles having a diameter of from about 100 nanometers (nm) to about 600 nm; and where the second monolayer comprises generally spherical nanoparticles having a diameter of from about 30 nanometers (nm) to about 600 nm According to example 52, there is provided a system for manufacturing an organic light emitting diode display device. The system may include: means for disposing one or more layers of organic light emitting elements between a first electrode and a transparent second electrode; and means for depositing a light-scattering layer proximate at least a portion of the transparent second electrode, the light-scattering layer including at least one monolayer of light-scattering nanoparticles.

Example 53 may include elements of example 52 where the means for depositing the light-scattering layer proximate at least the portion of the transparent second electrode further comprises: means for depositing a monolayer of light-scattering nanoparticles having a first index of refraction proximate at least a portion of the transparent second electrode.

Example 54 may include elements of any of examples 52 or 53 where the means for depositing the monolayer of light-scattering nanoparticles having the first index of refraction proximate at least the portion of the transparent second electrode further comprises: means for depositing a monolayer of transparent light-scattering nanoparticles having a first index of refraction proximate at least a portion of the transparent second electrode.

Example 55 may include elements of any of examples 52 through 54 where the means for depositing a monolayer of transparent light-scattering nanoparticles having a first index of refraction proximate at least a portion of the transparent second electrode further comprises: means for depositing a monolayer of asymmetric, transparent, light-scattering nanoparticles having a first index of refraction proximate at least a portion of the transparent second electrode.

Example 56 may include elements of any of examples 52 through 55 where the means for depositing the monolayer of asymmetric, transparent, light-scattering nanoparticles having the first index of refraction proximate at least the portion of the transparent second electrode further comprises: means for depositing a monolayer of randomly oriented, asymmetric, transparent, light-scattering nanoparticles having the first index of refraction proximate at least the portion of the transparent second electrode.

Example 57 may include elements of any of examples 52 through 56, and the system may further include: means for optically coupling the at least one monolayer of light-scattering nanoparticles to the transparent second electrode.

Example 58 may include elements of any of examples 52 through 57 where the means for depositing the light-scattering layer proximate at least the portion of the transparent second electrode further comprises: means for depositing a light-scattering layer that includes generally spherical, light-scattering, nanoparticles having a diameter of less than 1000 nanometers (nm) proximate at least the portion of the transparent second electrode.

Example 59 may include elements of any of examples 52 through 58 where the means for depositing the light-scattering layer that includes generally spherical light-scattering nanoparticles having a diameter of less than 1000 nanometers (nm) proximate at least the portion of the transparent second electrode further comprises: means for depositing a light-scattering layer that includes generally spherical, light-scattering, nanoparticles having a diameter of between 100 nanometers (nm) and 600 nm proximate at least the portion of the transparent second electrode.

Example 60 may include elements of any of examples 52 through 59 where the means for depositing the light-scattering layer proximate at least the portion of the transparent second electrode further comprises: means for depositing a light-scattering layer proximate at least the portion of the transparent second electrode, the light-scattering layer including a monolayer of light-scattering nanoparticles that includes at least one of: rutile particles, silicon nitride ($Si_3N_4$), titanium dioxide (TiO2), magnesium oxide (MgO), zinc oxide (ZnO), aluminum oxide ($Al_2O_3$), silicon oxide ($SiO_2$), indium oxide ($In_2O_3$), magnesium fluoride ($MgF_2$), hafnium oxide ($HfO_2$), zirconium oxide ($ZrO_2$), zirconium silicate ($ZrSiO_4$).

Example 61 may include elements of any of examples 52 through 60, and the system may further include: means for depositing an encapsulant layer proximate at least a portion of the light-scattering layer, the encapsulant having a second index of refraction, the second index of refraction less than the first index of refraction of the light-scattering nanoparticles.

Example 62 may include elements of any of examples 52 through 61, and the system may further include: means for depositing a circular polarizer layer proximate at least a portion of the encapsulant layer.

Example 63 may include elements of any of examples 52 through 62, and the system may further include: means for depositing a cover film layer proximate at least a portion of the circular polarizer layer.

Example 64 may include elements of any of examples 52 through 63 where the means for depositing the cover film layer proximate at least a portion of the circular polarizer layer further comprises: means for depositing a cover film that includes a first surface and a second surface proximate at least a portion of the circular polarizer layer, the first surface disposed proximate the circular polarizer layer and the second surface includes a textured surface.

Example 65 may include elements of any of examples 52 through 64 where the means for depositing a light-scattering layer proximate at least a portion of the transparent second electrode, the light-scattering layer including at least one monolayer of light-scattering nanoparticles comprises: means for depositing a light-scattering layer proximate at least a portion of the transparent second electrode, the light-scattering layer including: a first monolayer of light-scattering nanoparticles deposited proximate at least a portion of the transparent second electrode; and a second monolayer of light-scattering nanoparticles deposited proximate at least a portion of the first monolayer of light-scattering nanoparticles.

Example 66 may include elements of any of examples 52 through 65 where the means for depositing the first monolayer of light-scattering nanoparticles proximate at least a portion of the transparent second electrode comprises: means for depositing a first monolayer of light-scattering nanoparticles that includes nanoparticles having a first physical geometry; and where the means for depositing the second monolayer of light-scattering nanoparticles proximate at least a portion of the first monolayer of light-scattering nanoparticles comprises: means for depositing a monolayer of light-scattering nanoparticles that includes nanoparticles having a second physical geometry, the second physical geometry different than the first physical geometry.

Example 67 may include elements of any of examples 52 through 66 where the means for depositing a first monolayer of light-scattering nanoparticles that includes nanoparticles having a first physical geometry comprises: means for depositing a first monolayer that includes generally spherical nanoparticles having a diameter of from about 100 nanometers (nm) to about 600 nm; and means for depositing a second monolayer that includes generally spherical nanoparticles having a diameter of from about 100 nanometers (nm) to about 600 nm.

According to example 68, there is provided a system to reduce power consumption and improve the efficiency of OLED display devices, the system being arranged to perform the method of any of examples 18 through 33.

According to example 69, there is provided a chipset arranged to perform the method of any of examples 18 through 33.

According to example 70, there is provided at least one machine readable medium comprising a plurality of instructions that, in response to be being executed on a computing device, cause the computing device to carry out the method according to any of examples 18 through 33.

According to example 39, there is provided a device configured to reduce power consumption and improve the efficiency of OLED display devices, the device being arranged to perform the method of any of examples 18 through 33.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed:

1. An organic light emitting diode (OLED) display device, comprising:
    one or more layers of organic light emitting elements disposed between a first electrode and a transparent second electrode; and
    a light-scattering layer proximate at least a portion of the transparent second electrode, the light-scattering layer having a uniform light-scattering nanoparticle density across the at least the portion of the transparent second electrode, the light-scattering layer including:
       a first monolayer of first light-scattering nanoparticles, the first light-scattering nanoparticles in a first pattern proximate the portion of the transparent second electrode; and
       a second monolayer of second light-scattering nanoparticles, the second light-scattering nanoparticles in a second pattern proximate at least a portion of the first monolayer of the first light-scattering nanoparticles, the first pattern being complementary to the second pattern.

2. The OLED display device of claim 1, wherein the at least one of the first or second monolayers includes nanoparticles having a first index of refraction.

3. The OLED display device of claim 2, wherein the light-scattering nanoparticles include transparent light-scattering nanoparticles.

4. The OLED display device of claim 3, wherein the light-scattering nanoparticles comprise asymmetric, transparent, light-scattering nanoparticles.

5. The OLED display device of claim 4, wherein the light-scattering nanoparticles include randomly oriented light-scattering nanoparticles.

6. The OLED display device of claim 3, wherein at least one of the first monolayer of the first light-scattering nanoparticles or the second monolayer of the second light-scattering nanoparticles is optically coupled to the transparent second electrode.

7. The OLED display device of claim 3, wherein the light-scattering nanoparticles include generally spherical light-scattering nanoparticles having a diameter of less than 1000 nanometers (nm).

8. The OLED display device of claim 3, wherein the light-scattering nanoparticles include generally spherical light-scattering nanoparticles having a diameter of between 30 nanometers (nm) and 600 nm.

9. The OLED display device of claim 3, wherein the light-scattering nanoparticles include at least one of: rutile particles, silicon nitride ($Si_3N_4$), titanium dioxide ($TiO_2$), magnesium oxide (MgO), zinc oxide (ZnO), aluminum oxide ($Al_2O_3$), silicon oxide ($SiO_2$), indium oxide ($In_2O_3$), magnesium fluoride ($MgF_2$), hafnium oxide ($HfO_2$), zirconium oxide ($ZrO_2$), or zirconium silicate ($ZrSiO_4$).

10. The OLED display device of claim 3, further including:
an encapsulant layer across at least a portion of the light-scattering layer, the encapsulant layer having a second index of refraction, the second index of refraction less than the first index of refraction of the light-scattering nanoparticles.

11. The OLED display device of claim 10, further including:
a circular polarizer layer proximate and at least partially across the encapsulant layer.

12. The OLED display device of claim 11, further including:
a cover film layer proximate and at least partially across the circular polarizer layer.

13. The OLED display device of claim 12, wherein the cover film layer includes a first surface and a second surface, the first surface proximate the circular polarizer layer, and the second surface includes a textured surface.

14. The OLED display device of claim 12, wherein the cover film layer includes a titanium dioxide ($TiO_2$) monolayer proximate a surface of the cover film layer.

15. The OLED display device of claim 1, wherein the first monolayer of the first light-scattering nanoparticles includes nanoparticles having a first physical geometry, and the second monolayer of the second light-scattering nanoparticles includes nanoparticles having a second physical geometry, the second physical geometry different than the first physical geometry.

16. The OLED display device of claim 1, wherein the first monolayer includes generally spherical nanoparticles having a diameter of from about 30 nanometers (nm) to about 600 nm, and the second monolayer includes generally spherical nanoparticles having a diameter of from about 30 nanometers (nm) to about 600 nm.

17. The OLED display device of claim 1, wherein the first and second patterns correspond to a complementary checkerboard pattern.

18. The OLED display device of claim 1, wherein the one or more layers of organic light emitting elements are associated with multiple different pixels of the OLED display device, the light-scattering layer extends along an unobstructed plane across at least two of the different pixels.

19. A method of manufacturing an organic light emitting diode (OLED) display device, the method comprising:
disposing one or more layers of organic light emitting elements between a first electrode and a transparent second electrode; and
depositing a light-scattering layer proximate at least a portion of the transparent second electrode, the light-scattering layer including at least one monolayer of light scattering nanoparticles such that the light scattering layer has having a uniform light-scattering nanoparticle density across the portion of the transparent second electrode, the light-scattering layer including:
a first monolayer of first light-scattering nanoparticles, the first light-scattering nanoparticles deposited in a first pattern proximate the portion of the transparent second electrode; and
a second monolayer of second light-scattering nanoparticles, the second light-scattering nanoparticles deposited in a second pattern proximate at least a portion of the first monolayer of the first light-scattering nanoparticles, the first pattern arranged complementary to the second pattern.

20. The method of claim 19, wherein the depositing the first light-scattering layer includes depositing randomly oriented, asymmetric, transparent, light-scattering nanoparticles having a first index of refraction.

21. The method of claim 20, further including:
optically coupling at least one of the first monolayer of the first light-scattering nanoparticles or the second monolayer of the second light-scattering nanoparticles to the transparent second electrode.

22. The method of claim 19, wherein the depositing of the light-scattering layer includes depositing generally spherical, light-scattering, nanoparticles having a diameter of less than 1000 nanometers.

23. The method of claim 22, wherein the depositing of the light-scattering layer includes depositing generally spherical, light-scattering, nanoparticles having a diameter of between 30 nanometers (nm) and 600 nm.

24. The method of claim 19, wherein depositing the light-scattering layer includes at least one of: rutile particles, silicon nitride ($Si_3N_4$), titanium dioxide ($TiO_2$), magnesium oxide (MgO), zinc oxide (ZnO), aluminum oxide ($Al_2O_3$), silicon oxide ($SiO_2$), indium oxide ($In_2O_3$), magnesium fluoride ($MgF_2$), hafnium oxide ($HfO_2$), zirconium oxide ($ZrO_2$), or zirconium silicate ($ZrSiO_4$).

* * * * *

UNITED STATES PATENT AND TRADEMARK OFFICE
CERTIFICATE OF CORRECTION

PATENT NO. : 11,043,655 B2
APPLICATION NO. : 16/456797
DATED : June 22, 2021
INVENTOR(S) : Khaled Ahmed et al.

Page 1 of 1

It is certified that error appears in the above-identified patent and that said Letters Patent is hereby corrected as shown below:

In the Claims

In Claim 1, Column 22, Line 39, delete "disposed".

In Claim 4, Column 22, Line 63, delete "comprise" and insert --include--.

In Claim 19, Column 24, Lines 16-18, delete "including at least one monolayer of light scattering nanoparticles such that the light scattering layer has".

In Claim 22, Column 24, Line 43, after "nanometers" insert --(nm)--.

In Claim 24, Column 24, Line 48, delete "depositing".

Signed and Sealed this
Fifth Day of July, 2022

Katherine Kelly Vidal
*Director of the United States Patent and Trademark Office*